United States Patent
Tseng

(10) Patent No.: US 6,495,420 B2
(45) Date of Patent: Dec. 17, 2002

(54) METHOD OF MAKING A SINGLE TRANSISTOR NON-VOLATILE MEMORY DEVICE

(75) Inventor: Horng-Huei Tseng, Hsinchu (TW)

(73) Assignee: Vanguard International Semiconductor Corporation, Hsinchu (TW)

(*) Notice: Subject to any disclaimer, the term of this patent is extended or adjusted under 35 U.S.C. 154(b) by 0 days.

(21) Appl. No.: 09/782,238

(22) Filed: Feb. 12, 2001

(65) Prior Publication Data
US 2002/0110985 A1 Aug. 15, 2002

(51) Int. Cl.$^7$ ............................................. H01L 21/336
(52) U.S. Cl. ........................ 438/267; 438/304; 438/596
(58) Field of Search ................................. 438/267, 304, 438/596, 264, 257, 266, 564

(56) References Cited

U.S. PATENT DOCUMENTS

| | | | | |
|---|---|---|---|---|
| 5,445,983 A | * | 8/1995 | Hong | 437/43 |
| 5,479,047 A | * | 12/1995 | Liao et al. | 257/592 |
| 6,153,904 A | * | 11/2000 | Yang | 257/316 |
| 6,291,854 B1 | * | 9/2001 | Peng | 257/315 |
| 6,312,998 B1 | * | 11/2001 | Yu | 438/303 |
| 6,329,248 B1 | * | 12/2001 | Yang | 438/267 |

\* cited by examiner

Primary Examiner—Richard Elms
Assistant Examiner—Michael K. Luhrs
(74) Attorney, Agent, or Firm—Blakely Sokoloff Taylor & Zafman LLP

(57) ABSTRACT

The present invention includes forming a first oxide layer as a sacrificial dielectric layer on a semiconductor substrate. A nitride layer is formed on the sacrificial dielectric layer. Then, the sacrificial dielectric layer and the nitride layer are patterned to form an opening. Next, a second oxide layer is formed on the nitride layer and along a surface of the opening. Side wall spacers are created by etching. Then, a gate dielectric layer is formed on the exposed semiconductor substrate. A first polysilicon layer is deposited on the nitride layer. Subsequently, the first polysilicon layer is polished by CMP, followed by removing the nitride layer, the spacers and the sacrificial dielectric layer. A tunneling dielectric layer and a control gate are respectively formed on a surface of the floating gate.

30 Claims, 2 Drawing Sheets

METHOD OF MAKING A SINGLE TRANSISTOR NON-VOLATILE MEMORY DEVICE

The present invention relates to a semiconductor device, and more specifically, to a method of fabricating nonvolatile memories.

BACKGROUND OF THE INVENTION

The semiconductor industry has been advanced to the field of Ultra Large Scale Integrated (ULSI) technologies. The fabrication of the nonvolatile memories also follows the trend of the reduction of the size of a device. The nonvolatile memories include various types of devices, such as EAROM (electrically alterable read only memory), EEPROM (electrically erasable programmable read only memory), EEPROM-EAROMs and non-volatile SRAMS. Different types of devices have been developed for specific applications requirements in each of these segments. These parts have been developed with a focus on the high endurance and high speed requirements. In such device, electrical alterability is achieved by Fowler-Nordheim tunneling which is cold electron tunneling through the energy barrier at a silicon-thin dielectric interface and into the oxide conduction band. Typically, the thin dielectric layer is composed of silicon dioxide and the thin silicon dioxide layer allows charges to tunnel through when a voltage is applied to the gate. These charges are trapped in the silicon dioxide and remain trapped there since the materials are high quality insulators.

Various nonvolatile memories have been disclosed in the prior art. For example, Mitchellx has proposed EPROMs with self-aligned planar array cell. In this technique, buried diffusion self-aligned to the floating gate avalanche injection MOS transistor are used for the bit lines. See "A New Self-Aligned Planar Cell for Ultra High Density EPROMs, A. T. Mitchellx, IEDM, Tech. pp. 548–553, 1987". Bergemont proposed another cell array for high density flash EEPROM, which can be seen in "NOR Virtual Ground (NVG)—A New Scaling Concept for Very High Density FLASH EEPROM and its Implemntation in a 0.5 μm Process, A Bergemont, IEEE, pp. 15–18, 1993". This cell structure is introduced for scaling down the size of the devices to fabricate high density EEPROMs. Another prior art that relates to the field is the U.S. Pat. No. 4,203,158.

However, most of such device includes a floating gate transistor and a separate select transistor for each storage site. These structure occupies larger area, it does not meet the trend of the technology. One prior art discloses single transistor nonvolatile device. Please refer to U.S. Pat. No. 5,029,130 to Bing Yeh, which assigned to Silicon Storage Technology.

SUMMARY OF THE INVENTION

The object of the present invention is to form one single transistor nonvolatile memory which inlcudes a sharp corner to improve the efficiency of electron injection.

A method for manufacturing one single transistor nonvolatile memory is disclosed. The method comprises forming a first oxide layer as a sacrificial dielectric layer on a semiconductor substrate. A nitride layer is formed on the sacrificial dielectric layer. Then, the sacrificial dielectric layer and the nitride layer are patterned to form an opening therein, thereby exposing a portion of the semiconductor substrate. Next, a second oxide layer is formed on the nitride layer and along a surface of the opening. An etching is performed to etch the second oxide layer to form side wall spacers on side walls of the opening. Then, a gate dielectric layer is formed on the exposed semiconductor substrate. A first polysilicon layer is deposited on the nitride layer. Subsequently, the first polysilicon layer is polished by CMP and the nitride layer, the spacers and the sacrificial dielectric layer are stripped. A tunneling dielectric layer and a control gate are respectively formed on a surface of the floating gate.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
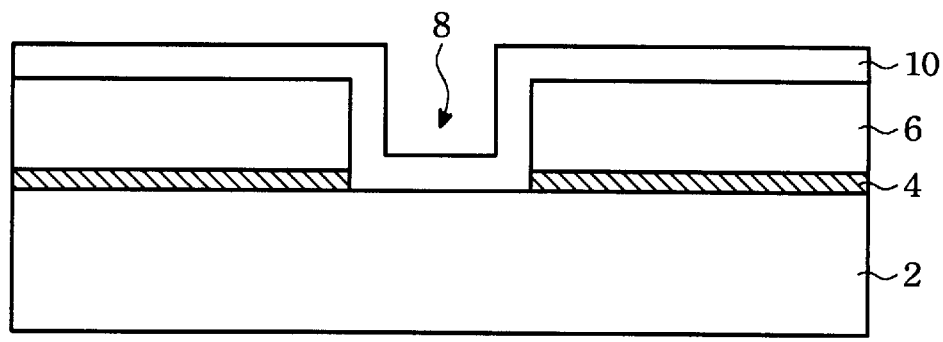
FIG. 1 is a cross section view of a semiconductor wafer illustrating the steps of forming a oxide, nitride layer and forming an opening on a semiconductor substrate according to the present invention.

The present invention proposes a novel method to fabricate a single transistor nonvolatile memory. In the method, spacers will be used to form a conductive layer. Further, the proposed recipe is [more simple] simpler than the prior art. The detailed description will be seen as follows. In a preferred embodiment, as shown in the FIG. 1, a single crystal silicon substrate 2 with a <100>or <111>crystallographic orientation is provided. A sacrificial dielectric layer such as oxide layer 4 is formed on the substrate 2 and subsequent first dielectric layer such as silicon nitride layer 6 or the like is formed on the oxide 4. Typically, the oxide 4 can be grown in an oxygen ambient in a furnace at a temperature of about 800 to 1100 degrees centigrade. The thickness of the silicon oxide layer 4 is about 50 to 500 angstroms. Other methods, such as chemical vapor deposition, can be used to form the oxide 4. Then, a silicon nitride layer 6 is deposited on the oxide 4. The silicon nitride layer 6 is deposited by any suitable process. For example, Low Pressure Chemical Vapor Deposition (LPCVD), Plasma Enhance Chemical Vapor Deposition (PECVD), High Density Plasma Chemical Vapor Deposition (HDPCVD). In the preferred embodiment, the reaction gases of the step to form silicon nitride layer include $SiH_4$, $NH_3$, $N_2$, or $SiH_2Cl_2$, $NH_3$, $N_2$, $N_2O$.

Next, a photoresist (not shown) having openings is patterned on the silicon nitride layer 6 using lithography process to expose portions of the silicon nitride layer 6. Then, an etching process is used to etch the silicon nitride layer 6, oxide 4 by using the photoresist as an etching mask. Thus, portions of the substrate 2 are exposed by this opening 8 in the nitride layer 6. In the preferably embodiment, the widths of the opening 8 may range from 0.5 to 0.1 micron.

After the silicon nitride pattern is defined, the photoresist is removed away.

Figure 2:
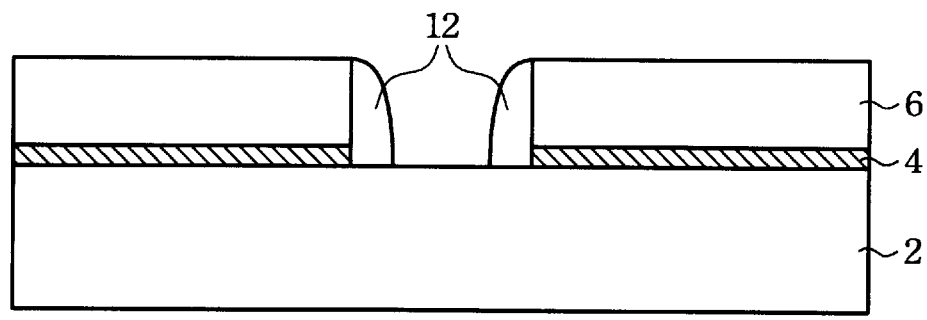
FIG. 2 is a cross section view of a semiconductor wafer illustrating the step of forming spacers according to the present invention.

Subsequently, another dielectric layer 10 is formed on the substrate 2, the first dielectric layer and along the surface of the opening 8 and the width of the opening 8 is squeezed, as shown in FIG. 1. In a case, the second dielectric layer 10 is formed by undoped oxide. Turning to FIG. 2, side-wall spacers 12 are formed on the side walls of the opening 8 by anisotropically etching the second dielectric layer 10. One option is the usage of plasma etching.

Figure 3:
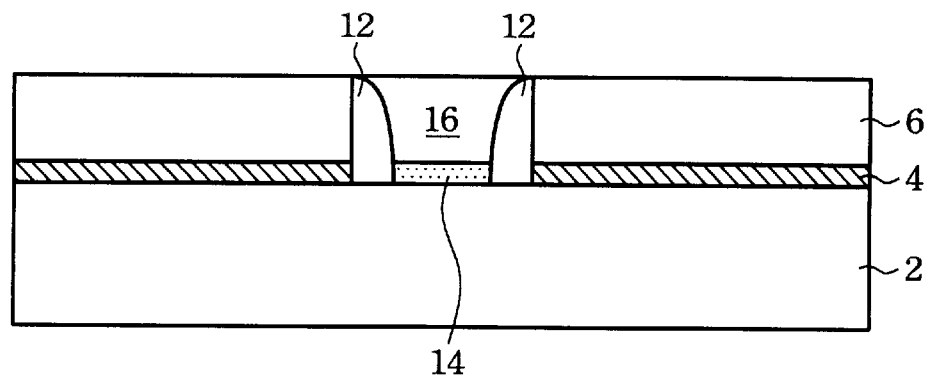
FIG. 3 is a cross section view of a semiconductor wafer illustrating the step of forming conductive layer according to the present invention.

Referencing to FIG. 3, a gate dielectric layer 14 is formed on the lower portion of the opening. The gate dielectric layer 14 is composed of oxide or oxynitride. Preferably, the silicon oxynitride layer 14 is formed by thermal oxidation in $N_2O$ or NO environment. The temperature for forming the silicon oxynitride layer 14 ranges from 700 to 1150 degrees centigrade. The thickness is preferably about 25 to 150 angstroms.

Next, as can be seen by reference to FIG. 3, a conductive layer, such as doped polysilicon layer 16, is formed on the nitride layer 6 and refilled into the narrowed opening 8. The doped polysilicon layer 16 can be chosen from doped polysilicon or in-situ doped polysilicon. In addition, the metal or alloy layer can be used as the conductive layer. Then, a chemical mechanical polishing (CMP) is performed to remove a portion of the polysilicon layer 16. A planar topography is achieved by using the well-known technology.

Figure 4:
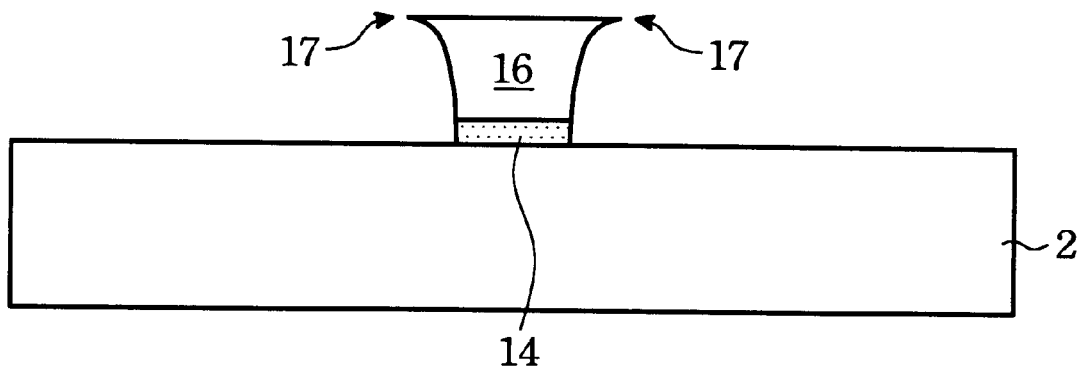
FIG. 4 is a cross section view of a semiconductor wafer illustrating the step of forming floating gate according to the present invention.

Turning to FIG. 4, the following step is to remove the silicon nitride 6, the spacer 12 and the sacrificial dielectric layer 4, thereby remaining polysilicon structure with curved profile as a floating gate. It is has to be noted that the floating gate includes sharp corner 17 on the upper portion, which improves the efficiency of the electron injection. In the embodiment, the silicon nitride can be removed by using hot phosphorus acid solution and the oxide may be removed by buffer oxide etching solution (BOE) or HF solution.

Figure 5:
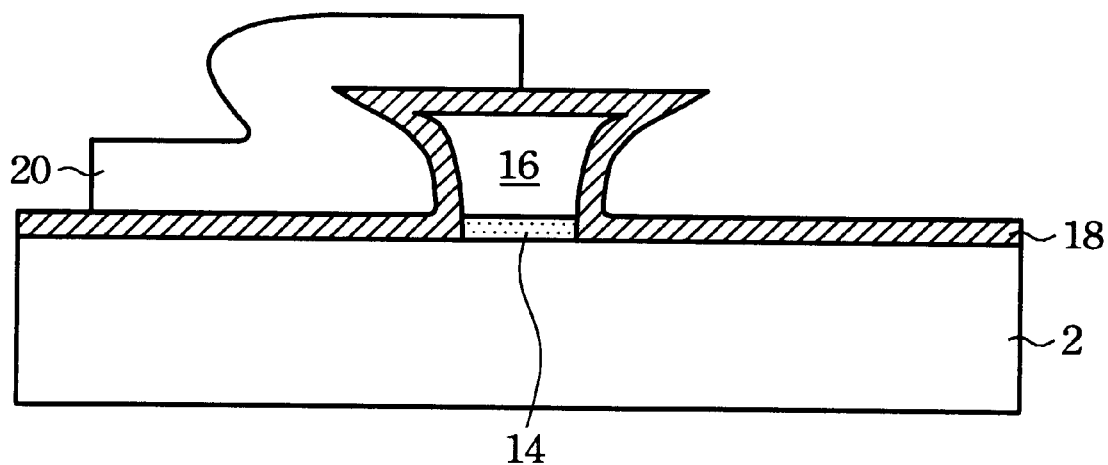
FIG. 5 is a cross section view of a semiconductor wafer illustrating the steps of forming control gate according to the present invention.

As shown in FIG. 5, a dielectric layer 18 is formed along the surface of the floating gates 16 as a tunneling dielectric layer. Preferably, the tunneling dielectric may be composed by oxide, nitride, silicon oxynitride, silicon oxide ON (oxide/nitride) or ONO (oxide/nitride/oxide). A further conductive layer 20, such as doped polysilicon layer, is formed on the tunneling dielectric 18 as a control gate. Finally, the lithography and etching process is used to define the control gate 20.

As will be understood by persons skilled in the art, the foregoing preferred embodiment of the present invention is illustrative of the present invention rather than limiting the present invention. Having described the invention in connection with a referred embodiment, modification will now suggest itself to those skilled in the art. Thus, the invention is not to be limited to this embodiment, but rather the invention is intended to cover various modifications and similar arrangements included within the spirit and scope of the appended claims, the scope of which should be accorded the broadest interpretation so as to encompass all such modifications and similar structures.

While the preferred embodiment of the invention has been illustrated and described, it will be appreciated that various changes can be made therein without departing from the spirit and scope of the invention.

What is claimed is:

1. A method for manufacturing one single transistor nonvolatile memory on a semiconductor substrate, said method comprising the steps of:

forming a sacrificial dielectric layer on said semiconductor substrate;

forming a first dielectric layer on said sacrificial dielectric layer;

patterning said sacrificial dielectric layer and said first dielectric layer to form an opening therein, thereby exposing a portion of said semiconductor substrate;

forming a second dielectric layer on said first dielectric layer and along a surface of said opening;

etching said second dielectric layer to form side wall spacers on side walls of said opening, wherein said semiconductor substrate is exposed by said side wall spacers;

forming a gate dielectric layer on said exposed semiconductor substrate;

forming a first conductive layer on said first dielectric layer and refilling into said opening;

removing said first conductive layer to achieve a planar surface;

removing said first dielectric layer, said side wall spacers, said sacrificial dielectric layer, thereby forming a floating gate with a sharp corner;

forming a tunneling dielectric layer on a surface of said floating gate; and forming a second conductive layer on said tunneling dielectric layer as a control gate.

2. The method of claim 1, wherein said first dielectric layer comprises silicon nitride.

3. The method of claim 2, wherein said first dielectric layer is removed by hot phosphorus acid solution.

4. The method of claim 1, wherein said second dielectric layer comprises silicon oxide.

5. The method of claim 4, wherein said side wall spacers are removed by HF solution.

6. The method of claim 4, wherein said side wall spacers are removed by BOE (buffer oxide etching) solution.

7. The method of claim 1, wherein said sacrificial dielectric layer comprises silicon oxide.

8. The method of claim 7, wherein said sacrificial dielectric layer is removed by HF solution.

9. The method of claim 7, wherein said sacrificial dielectric layer is removed by BOE (buffer oxide etching) solution.

10. The method of claim 1, wherein said first conductive layer comprises polysilicon.

11. The method of claim 1, wherein said second conductive layer comprises polysilicon.

12. The method of claim 1, wherein said tunneling dielectric layer comprises silicon oxynitride.

13. The method of claim 1, wherein said tunneling dielectric layer comprises silicon nitride.

14. The method of claim 1, wherein said tunneling dielectric layer comprises silicon oxide.

15. The method of claim 1, wherein said tunneling dielectric layer comprises ON (oxide/nitride).

16. The method of claim 1, wherein said tunneling dielectric layer comprises ONO (oxide/nitride/oxide).

17. A method for manufacturing one single transistor nonvolatile memory on a semiconductor substrate, said method comprising the steps of:

forming a first oxide layer as a sacrificial layer on said semiconductor substrate;

forming a nitride layer on said sacrificial layer;

patterning said sacrificial layer and said nitride layer to form an opening therein, thereby exposing a portion of said semiconductor substrate;

forming a second oxide layer on said nitride layer and along a surface of said opening;

etching said second oxide layer to form side wall spacers on side walls of said opening, wherein said semiconductor substrate is exposed by said side wall spacers;

forming a gate dielectric layer on said exposed semiconductor substrate;

forming a first polysilicon layer on said nitride layer and refilling into said opening;

removing said first polysilicon layer to achieve a planar surface;

removing said nitride layer, said side wall spacers, said sacrificial layer, thereby forming a floating gate;

forming a tunneling dielectric layer on a surface of said floating gate; and forming a second polysilicon layer on said tunneling dielectric layer as a control gate.

18. The method of claim 17, wherein said nitride layer is removed by hot phosphorus acid solution.

19. The method of claim 17, wherein said side wall spacers and first oxide layer are removed by HF solution or BOE (buffer oxide etching) solution.

20. The method of claim 17, wherein said tunneling dielectric layer is selected from a group consisting of silicon oxynitride, silicon nitride, silicon oxide ON (oxide/nitride) and ONO (oxide/nitride/oxide).

21. A method for forming a gate structure with sharp corner, said method comprising the steps of:

forming a sacrificial dielectric layer on said semiconductor substrate;

forming a first dielectric layer on said sacrificial dielectric layer;

patterning said sacrificial dielectric layer and said first dielectric layer to form an opening therein, thereby exposing a portion of said semiconductor substrate;

forming a second dielectric layer on said first dielectric layer and along a surface of said opening;

etching said second dielectric layer to form side wall spacers on side walls of said opening, wherein said semiconductor substrate is exposed by said side wall spacers;

forming a gate dielectric layer on said exposed semiconductor substrate;

forming a first conductive layer on said first dielectric layer and refilling into said opening;

removing said first conductive layer to achieve a planar surface;

removing said first dielectric layer, said side wall spacers, said sacrificial dielectric layer, thereby forming said gate with a sharp corner.

22. The method of claim 21, wherein said first dielectric layer comprises silicon nitride.

23. The method of claim 21, wherein said first dielectric layer is removed by hot phosphorus acid solution.

24. The method of claim 21, wherein said second dielectric layer comprises silicon oxide.

25. The method of claim 24, wherein said side wall spacers are removed by HF solution.

26. The method of claim 24, wherein said side wall spacers are removed by BOE (buffer oxide etching) solution.

27. The method of claim 21, wherein said sacrificial dielectric layer comprises silicon oxide.

28. The method of claim 27, wherein said sacrificial dielectric layer is removed by HF solution.

29. The method of claim 27, wherein said sacrificial dielectric layer is removed by BOE (buffer oxide etching) solution.

30. The method of claim 21, wherein said first conductive layer comprises polysilicon.

* * * * *